United States Patent [19]

Kamei et al.

[11] 3,801,885

[45] Apr. 2, 1974

[54] MULTI-LAYER SEMI-CONDUCTOR DEVICE TO BE TURNED ON BY A STRESS APPLIED THERETO

[75] Inventors: Tatsuya Kamei; Takuzo Ogawa, both of Hitachi; Hiroshi Kodera, Hino; Yozo Kanda, Kokubunji, all of Japan

[73] Assignee: Hitachi, Ltd., Tokyo, Japan

[22] Filed: Mar. 30, 1973

[21] Appl. No.: 346,298

Related U.S. Application Data

[63] Continuation of Ser. No. 170,594, Aug. 10, 1971, abandoned.

[30] Foreign Application Priority Data

Aug. 12, 1970 Japan ................................ 45-70057

[52] U.S. Cl...... 317/235 R, 317/235 M, 317/235 U, 317/235 AB, 307/310

[51] Int. Cl........................... H01l 15/00, H01l 11/00

[58] Field of Search .............. 317/235, 26, 41.1, 31; 307/308, 310; 73/88.5 SD

[56] References Cited

UNITED STATES PATENTS

| | | | |
|---|---|---|---|
| 3,339,085 | 8/1967 | Schmid et al. | 317/235 M |
| 3,444,444 | 5/1969 | Yamashita et al. | 317/235 M |
| 3,458,781 | 7/1969 | Simon | 317/235 AB |
| 3,634,931 | 1/1972 | Kano et al. | 317/235 |

FOREIGN PATENTS OR APPLICATIONS

| | | | |
|---|---|---|---|
| 1,051,550 | 12/1966 | Great Britain | 317/235 M |

*Primary Examiner*—Andrew J. James
*Attorney, Agent, or Firm*—Craig and Antonelli

[57] ABSTRACT

A multi-layer semiconductor device to be turned on by a stress applied thereto comprises four contiguous regions of pnpn type, the intermediate p type region being exposed on the side of the exterior n type region and having a greatly reduced thickness in said exposed portion.

6 Claims, 5 Drawing Figures

INVENTORS

TATSUYA KAMEI, TAKUZO OGAWA,

HIROSHI KODERA, YOZO KANDA

BY Craig, Antonelli & Hill

ATTORNEYS

INVENTORS
TATSUYA KAMEI, TAKUZO OGAWA,
HIROSHI KODERA, YOZO KANDA
BY Craig, Antonelli & Hill
ATTORNEYS

A MULTI-LAYER SEMI-CONDUCTOR DEVICE TO BE TURNED ON BY A STRESS APPLIED THERETO

This is a continuation, of application Ser. No. 170,594 filed Aug. 10, 1971, now abandoned.

BACKGROUND OF THE INVENTION

1. Field of the Invention

This invention relates to a multi-layer semiconductor device to be turned on by a stress applied thereto (hereinbelow referred to as a stress effect semiconductor element).

2. Description of the Prior Art

As a pnpn type stress effect semiconductor element, there has been known one which used the pressure sensitive property of a Schottky barrier. This stress effect semiconductor element has four layers of PNPN-type, and a metal film formed on that surface of the intermediate N-type layer which is exposed forming a same plane with that of the exterior P-type layer, a voltage to be applied between said metal film and the exterior P-type layer so as to make a reverse bias with respect to the schottky barrier formed between the metal film and the N-type layer. Under the condition that a voltage is applied between the exterior N-and P-type layers so that the P-type layer has a higher voltage, when a stress is applied to the metal film, a current is allowed to flow from the intermediate N-type layer to the exterior P-type layer through the Schottky barrier, achieving a similar function as a gate current allowed to flow in a thyristor and thus turning on the element. Since the current allowed to flow through the Schottky barrier is proportional to the stress applied to the metal film provided that a constant reverse bias is applied, this element can be used not only as a thyristor which is turned on by a stress application, but also as a stress detecting element when a stress above a predetermined value is applied.

In such a stress effect semiconductor element utilizing the pressure sensitivity of a Schottky barrier, there is a need for forming a Schottky barrier as well as a pnpn structure, and thus the manufacture of the element is rather complicated. Further, there is needed an additional voltage source for reversely biasing the Schottky barrier. Especially, in the case of using a stress effect semiconductor element as a thyristor which is turned on and off by the application and removal of a stress, the cross section of current flow may become smaller by the application of a stress and an additional means becomes necessary for applying a stress and thereby there are no improvements or advantages compared with a thyristor which is turned on and off through the gate electrode. Therefore, stress effect semiconductor elements utilizing the pressure sensitive effect of a Schottky barrier can only be used as a stress detection element.

SUMMARY OF THE INVENTION

An object of this invention is to provide a stress effect semiconductor element of a PNPN structure which can be turned on without need for a special current source for allowing a gate current to flow.

Another object of this invention is to provide a stress effect semiconductor element of a PNPN structure which can be turned on by a small stress application.

A further object of this invention is to provide a stress effect, PNPN, semiconductor element which is simple in structure and easy to use.

DESCRIPTION OF THE PREFERRED EMBODIMENTS

First, the stress effect semiconductor element of this invention will be described in connection with the accompanying drawing.

Figure 1:
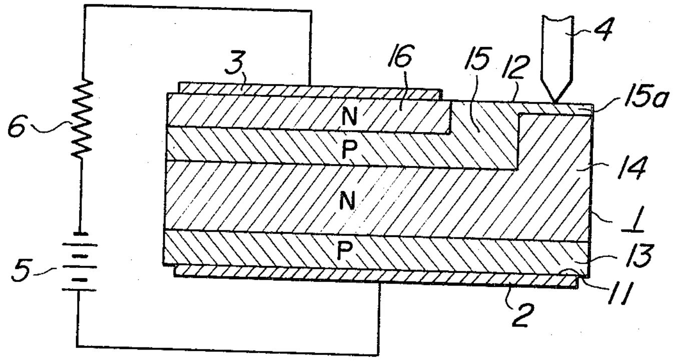
FIG. 1 is a schematic cross sectional diagram of a basic embodiment of a stress effect semiconductor element according to this invention.

In FIG. 1, a semiconductor substrate 1 has a pair of mutually opposed principal surfaces 11 and 12, and comprises four contiguous layers 13, 14, 15 and 16 of alternating conductivity type, PNPN, between the principal surfaces 11 and 12. One outer layer 16 does not occupy one whole principal surface but allows a part of the adjacent intermediate layer 15 to be exposed on the principal surface. Further, a part 15*a* of the exposed portion of the intermediate layer 15 is designed to be extremely thin compared with other portion. A pair of electrodes 2 and 3 are ohmically contacted with low resistance to the outer layers 13 and 16 on the principal surfaces. A pressure point 4 is provided for applying a pressure on the thin portion 15*a* of the intermediate layer 15.

When a voltage is applied to a stress effect semiconductor element of such a structure from a voltage source 5 to keep the electrode 2 at a higher voltage than the electrode 3, the PN junction between the intermediate layers 14 and 15 is reversely biased and depletion layers are formed on the both sides of this PN junction to block the voltage, though the PN junctions between the outer layer 13 and the intermediate layer 14 and between the intermediate layer 15 and the outer layer 16 are forwardly biased. Under such conditions, when a stress is applied to the thinned portion 15*a* of the intermediate layer 15 by the pressure point 4, this pressure is transmitted to the reversely biased PN junction through said portion 15*a*. An application of a stress to a reversely biased PN junction increases the leakage current. This is a hole current which flows from the thin portion 15*a* to the portion not thin, i.e., the portion adjacent to the outer layer 16. By this hole current, the voltage of the intermediate layer 15 becomes higher than that of the outer layer 16 and electrons are injected from the outer layer 16 to the intermediate layer 15. These processes resemble the case of allowing a current to flow from a gate electrode to a cathode electrode in a usual triode thyristor. Thus, the element can be turned on similar to a thyristor and allow a current to flow through a circuit formed of the element, the voltage source 5, and a load 6. The load 6 exists in the case of using the element as a thyristor which is turned on by the application of a stress. When using the element as a stress detecting element, the load 6 is replaced with a detector for detecting current.

Figure 2:
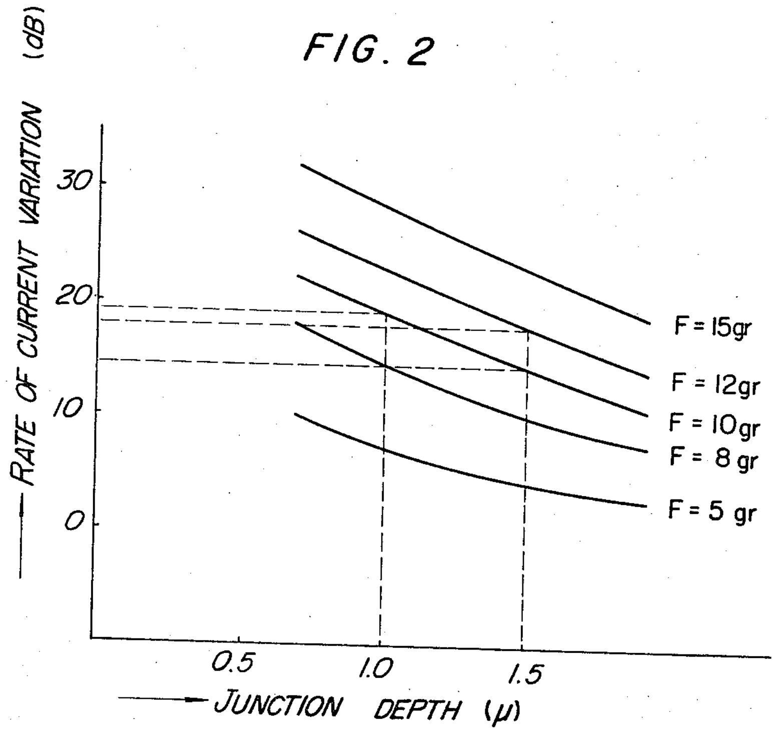
FIG. 2 is a diagram of characteristic curves representing the relation of the junction depth and the rate of current variation at various stress.

As is described hereinabove, in the stress effect semiconductor element of this invention, the leakage current of a reversely biased PN junction is increased by a stress application so as to turn on the element. Here, it is important for the operation of the element to make the depth of the reversely biased PN junction in the portion that is applied with a stress, i.e., the thickness of the thin portion 15*a* of the intermediate layer 15, very small. This is apparent from FIG. 2. FIG. 2 shows characteristic curves representing the relationship of the depth of the reversely biased pn junction, i.e., the thickness of the portion of the intermediate layer 15*a*, and the rate of current variation with stress applied to the pressure point varied as a parameter. Here, the pressure point was a needle having a radius of curvature of 25 $\mu$ at the tip portion, and the rate of current variation is represented as 20 $\log_{10}(I_2/I_1)$ (dB), where $I_1$ is the leakage current before the stress application and $I_2$ is the leakage current under the stress application.

From this figure, when the portion of the intermediate layer 15*a* has a thickness of $1\mu$, and a force of 8 grams is applied through the pressure point, the rate of current variation is 14.5 dB which is equivalent to the case when the thickness is $1.5\mu$ and a force of 10 grams is applied. Further, the rate of current variation in the case of a thickness of $1.5\mu$ and a force of 12 grams is smaller than that in the case of a thickness of $1.0\mu$ and a force of 10 grams. Thus, the thinner the portion 15*a* of the intermediate layer, the larger becomes the rate of current variation. In other words, for providing a predetermined rate of current variation, smaller stress will be sufficient for a thinner junction dept. Therefore, the portion 15*a* of the intermediate layer is preferably made as thin as possible provided that it does not prevent the flow of a hole current which is allowed to flow from the portion 15*a* to that portion of the intermediate layer 15 which is adjacent to the outer layer 16 upon the application of a stress.

Next, the manufacture of a semiconductor substrate to be used in such a stress effect semiconductor element will be described.

First, after a silicon dioxide film is selectively formed on a part of one principal surface of a silicon substrate of one conductivity type, for example N-type, impurity atoms generating the other conductivity type, for example boron, are diffused from both the principal surfaces. By this boron diffusion, the substrate is changed into P-type except that portion which is covered with the oxide film and those layers which correspond to the outer layer 13 and the intermediate layers 14 and 15 of FIG. 1 are formed. Then, by partially removing the oxide film on one principal surface which has been formed by the boron diffusion, impurity atoms generating one conductivity type, for example phosphorous, are diffused from the exposed surface to form a layer which corresponds to the outer layer 16 of FIG. 1. Then, by exposing the N-type portion left under the oxide film on one principal surface, an extremely thin layer having a thickness of about $1\mu$ compared with the other layers which corresponds to the layer 15*a* of FIG. 1 is formed by boron diffusion. Thus, a semiconductor substrate to be used in the stress effect semiconductor element of this invention is formed.

According to the stress effect semiconductor element as described above, there is no need for a special power source for turning on the element, thereby the manufacture of an element and a device using this element becomes much easier.

Figure 3:
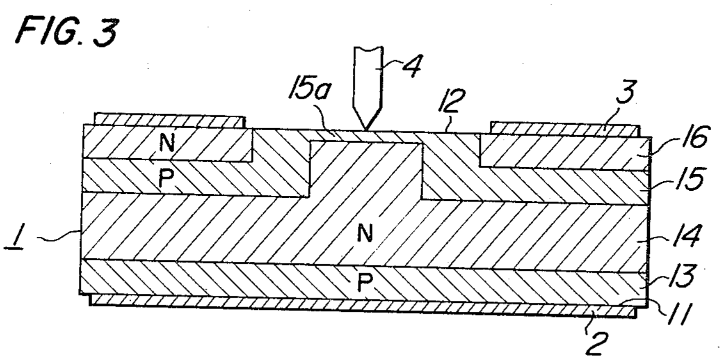
FIGS. 3, 4 and 5 are schematic cross sectional diagrams of other embodiments of stress effect semiconductor element according to this invention.

FIG. 3 shows another embodiment of a stress effect semiconductor element according to the invention, in which that portion 15*a* of the intermediate layer 15 which is made thin and applied with a stress is formed at an approximately central portion of one principal surface 12 of the semiconductor substrate 1. By such a junction structure, an element of high breakdown voltage can be provided since when a voltage is applied between the electrodes 2 and 3 to keep the electrode 2 at a higher voltage than that of the electrode 3, the intermediate layer 15 is thicker in the portion where the pn junction between the intermediate layers 14 and 15 is exposed and where depletion layers are formed to block the voltage, thus forming large depletion layers. If the portion 15*a* of the layer 15 having a decreased thickness is located near the edge of the semiconductor substrate as is the case with FIG. 1, the depletion layer cannot extend greatly and hence the element may be broken over at a relatively low voltage. Thus, the elements as shown in FIG. 1 has a relatively low breakdown voltage.

Figure 4:
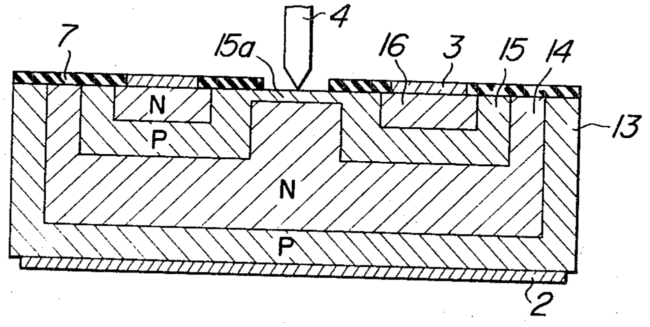

FIG. 4 shows yet another embodiment of this invention, which has such a planar structure that all three pn junctions formed between four layers of pnpn type are exposed on one principal surface side. By such a structure, one principal surface 12 in whcih all pn junctions are exposed is covered with an oxide film except those portions where the electrode 3 is formed and where the pressure means 4 is provided. Further, the isolating distance between the respective pn junctions can be made larger compared with the case when a pn junction is exposed at the end surface of the substrate, and thus an element of higher break-down voltage can be provided.

According to the structures as shown in FIGS. 3 and 4, since the pressure means is located approximately at the center of the substrate, the provision of the pressure means is easy when the substrate is introduced into a hermetic vessel (for example, when said element is to be used as a push-button switch).

Figure 5:
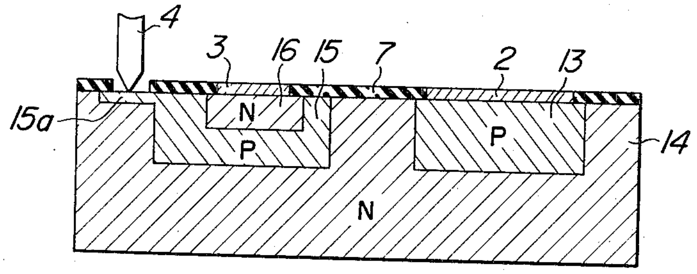

FIG. 5 shows a further embodiment of this invention, which has a modified planar structure. Namely, a lateral structure in which the respective regions are dispersed in one principal surface.

More particularly, the contiguous four layers 13, 14, 15 and 16 of pnpn type are formed in such a manner that in one intermediate layer 14, one outer region 13 and the other intermediate region 15 are embedded with surfaces exposed and that in said other intermediate region 15, the other outer region 16 is embedded with a surface exposed. The portion 15*a* of a decreased thickness of the intermediate region 15 is formed on the farther side of the region 15 from the outer region 13.

Elements of this structure can be easily made by selective diffusion from one principal surface of a semiconductor substrate. Further, the semiconductor substrate necessarily has a thickness of only three layers 14, 15 and 16, and thus it can be made thinner by the thickness of one outer layer 13.

We claim:

1. A multi-layer semiconductor device to be turned-on by a stress applied thereto comprising:

a semiconductor substrate comprising a first region of one conductivity type, a second region of another conductivity type formed contiguous to said first region forming a P-N junction therebetween, a third region of said one conductivity type formed contiguous to said second region forming a P-N junction therebetween, and a fourth region of said another conductivity type formed contiguous to said third region forming a P-N junction therebetween, a portion of said second region being exposed on the same plane as the surface of the first region and having a decreased thickness in the exposed portion compared with other portions ;

a pair of main electrodes ohmically contacted with low resistance to said first and fourth regions of the semiconductor substrate; and means for applying a mechanical stress via said exposed portion of the second region to the P-N junction between said second and third regions thereby to turn the device from the off state to the on state only through said stress, under such a condition that the voltage reverse-biasing the P-N junction between said second and third regions is applied between said main electrodes.

2. A multi-layer semiconductor device to be turned-on by a stress applied thereto according to claim 1 in which said first region of the substrate surrounds said exposed portion of said second region.

3. A multi-layer semiconductor device to be turned-on by a stress applied thereto according to claim 1, in which said third region, said second and fourth regions are embedded so as to expose the surfaces thereof on the same surface, in said second region said first region is embedded so as to expose the surface thereof, and said exposed portion of said second region is formed at a position on the far side of said first region from said fourth region.

4. A multi-layer semiconductor device to be turned-on by a stress applied thereto according to claim 2, in which all of the p-n junctions formed between said first, second, third and fourth regions are formed to be exposed on the same surface of the semiconductor substrate.

5. A multi-layer semiconductor device to be turned-on by a stress applied thereto comprising:

a semiconductor substrate comprising a first region of one conductivity type, a second region of another conductivity type formed contiguous to said first region forming a P-N junction therebetween, a third region of said one conductivity type formed contiguous to said second region forming a P-N junction therebetween and a fourth region of said another conductivity type formed contiguous to said third region forming a P-N junction therebetween;

a pair of main electrodes ohmically contacting , with low resistance, said first and fourth regions of the semiconductor substrate; and means for exclusively turning the device from the off state to the on state by applying a mechanical stress by way of an exposed portion of said second region exposed on the same plane as the surface of the first region and having a decreased thickness in the exposed portion compared with other portions, to the P-N junction between said second and third regions , under such a condition that a voltage reverse-biasing the P-N junction between said second and third regions is applied between said pair of main electrodes.

6. A multi-layer semiconductor device to be turned -on by a stress applied thereto, according to claim 5, wherein the second region has a portion thereof formed contiguous to said third region but not contiguous to said first region and continuous to said second region, said mechanical stress being applied to a P-N junction between said third region and said portion of said third region.

* * * * *